US005532916A

United States Patent [19]
Tamagawa

[11] Patent Number: 5,532,916
[45] Date of Patent: Jul. 2, 1996

[54] VOLTAGE CONVERTING CIRCUIT AND MULTIPHASE CLOCK GENERATING CIRCUIT USED FOR DRIVING THE SAME

[75] Inventor: Akio Tamagawa, Tokyo, Japan

[73] Assignee: NEC Corporation, Tokyo, Japan

[21] Appl. No.: 438,655

[22] Filed: May 9, 1995

Related U.S. Application Data

[62] Division of Ser. No. 115,210, Sep. 2, 1993, Pat. No. 5,461,557.

[30] Foreign Application Priority Data

Sep. 2, 1992 [JP] Japan ................................. 4-234387

[51] Int. Cl.⁶ ....................................................... H02M 3/06
[52] U.S. Cl. ........................... 363/62; 320/1; 307/110
[58] Field of Search ................................. 363/62; 320/1; 307/110

[56] References Cited

U.S. PATENT DOCUMENTS

| | | |
|---|---|---|
| 4,205,369 | 5/1980 | Asano . |
| 4,259,715 | 3/1981 | Morokawa . |
| 4,777,577 | 10/1988 | Bringham et al. . |
| 4,807,104 | 2/1989 | Floyd et al. . |
| 4,812,961 | 3/1989 | Essaff et al. . |
| 4,897,774 | 1/1990 | Bringham et al. . |
| 4,999,761 | 3/1991 | Bringham et al. . |
| 5,237,209 | 8/1993 | Brewer . |

FOREIGN PATENT DOCUMENTS

| | | |
|---|---|---|
| 4067769 | 3/1992 | Japan . |
| 2035723 | 6/1980 | United Kingdom . |

OTHER PUBLICATIONS

Ichirou Oota et al., "A Realization of . . . Using Switched-Capacitor Transformers and Its Analysis", J. of Japan Society of Electronics and Communication Eng., 83/8, vol. J66–C, No. 8, pp. 576–583.

F. Ueno et al., "Analysis of Fundamental Properties of Ideal Switched–Capacitor Power Supplies", J. of Japan Society of Electronics and Commincation Engineers, 84/4, vol. J67–C No. 4, pp. 424–425.

*Primary Examiner*—Peter S. Wong
*Assistant Examiner*—Y. Jessica Han
*Attorney, Agent, or Firm*—Sughrue, Mion, Zinn, Macpeak & Seas

[57] ABSTRACT

A voltage converting circuit of the charge pump step-up type includes a first circuit means for charging each of first and second capacitors with the voltage of a voltage source at a first timing. A second circuit operates to serially connect the charged first capacitor between a positive electrode of the voltage source and a positive voltage output terminal at a second timing so that a positive voltage which is a double of the voltage source voltage, is supplied from positive voltage output terminal. A third circuit operates to the charged first and second capacitors in series between a ground terminal and a negative voltage output terminal at a third timing so that a negative voltage which is a double of the voltage source voltage, is supplied from the negative voltage output terminal. Since the positive voltage and the negative voltage are generated independently of each other, a voltage variation on one of the positive and negative voltage output terminals caused by an external load causes no voltage variation on the other of the positive and negative voltage output terminals.

4 Claims, 12 Drawing Sheets

VOLTAGE CONVERTING CIRCUIT AND MULTIPHASE CLOCK GENERATING CIRCUIT USED FOR DRIVING THE SAME

This is a divisional of application No. 08/115,210 filed Sep. 2, 1993 now U.S. Pat. No. 5,461,557.

BACKGROUND OF THE INVENTION

1. Field of the Invention

The present invention relates to a voltage converting circuit and a multiphase clock generating circuit used for the same, and more specifically to a charge-pump type voltage converting circuit for generating large positive and negative voltages from a single voltage source, and a multiphase clock generating circuit for driving the charge-pump type voltage converting circuit.

2. Description of Related Art

In the prior art, various voltage converting circuits and multiphase clock generating circuits used for the voltage converting circuits have been known. The voltage converting circuits can be classified into a step-up circuit and a step-down circuit.

(1) Step-up Voltage Converting Circuit

Conventionally, in order to obtain from a single voltage source a positive or negative output voltage having the magnitude larger than voltage source voltage, the step-up voltage converting circuit has been widely used in a voltage supply circuit for RS-232C driver/receiver IC (integrated circuit) and others. Some typical examples of the conventional step-up voltage converting circuit are disclosed in U.S. Pat. Nos. 4,777,577, 4,897,774, 4,999,761, 4,807,104 and 4,812,961. The step-up voltage converting circuits shown in these U.S. patents are configured to be operated with a 2-phase clock, and are constructed of a so-called switched capacitor circuit type.

For example, the conventional step-up voltage converting circuit disclosed in FIG. 1A of U.S. Pat. No. 4,777,577 includes a step-up circuit part for generating a voltage which is double a voltage source voltage so that a doubled voltage is outputted from a positive voltage output terminal 40, and an inverting circuit part for generating an inverted voltage having the same magnitude as the doubled voltage so that the inverted doubled voltage is outputted from a negative voltage output terminal 38.

However, when the positive voltage output terminal 40 is connected to a large load which causes a voltage of positive voltage output terminal to drop, a voltage of a positive reservoir capacitor 22 and a voltage of an inverting capacitor 24 correspondingly drop. Namely, the absolute value of the voltage of the negative voltage output terminal 38 becomes small, with the result that another circuit connected to the negative voltage output terminal 38 becomes unable to maintain a stable operation. In addition, since variation in the voltage of the positive voltage output terminal 40 causes variation in the voltage of the negative voltage output terminal 38, if a voltage supply circuit is constituted of this step-up circuit, the variation of the output voltage becomes double, with the result that an overall system including the voltage supply circuit therein has a remarkably lowered reliability.

Furthermore, the conventional step-up circuit can generate a pair of positive and negative voltages such as $\pm 2V_{DD}$ or $\pm 3V_{DD}$, which have the same absolute value and which have the magnitude that is an integer multiple of the voltage source voltage. However, it is sometimes required to supply positive and negative biasing voltages having different absolute values, for example, $+3V_{DD}$ and $-2V_{DD}$, as in a bias voltage generating circuit for a CCD (charge coupled device) driver IC. For this application, the conventional step-up circuit cannot be used.

(2) Step-down Voltage Converting Circuit

Conventionally, the step-down voltage converting circuit has been used for obtaining from a single voltage source a positive or negative output voltage having a magnitude smaller than a voltage source voltage. If this step-down circuit is incorporated on a printed circuit board, it is ordinary to use a three-terminal voltage regulator or a switching regulator using a solenoid. The three-terminal voltage regulator has to be implemented in a bipolar process, and has a large loss in its output stage transistor. On the other hand, the switching regulator has a loss smaller than that of the three-terminal regulator, but inevitably has a large scale since the solenoid must be incorporated therein.

Under this circumstance, in the case of incorporating a step-down circuit in a CMOS (complementary metal-oxide-semiconductor) integrated circuit, a switched capacitor type step-down circuit has been used which is highly compatible with a CMOS integrated circuit manufacturing process and which has less loss. One typical example of the conventional switched capacitor type step-down circuit is shown in Journal of Japan Society of Electronics and Communication Engineers, 83/8, Vol. J66-C, No. 8, pp 576–583.

This step-down circuit includes a reservoir capacitor connected between a positive voltage output terminal and a ground terminal, and a transfer capacitor having the same capacitance as that of the reservoir capacitor. During a first phase, these capacitors are connected in series between a positive electrode and a negative electrode of a voltage source, so that each of the capacitors is charged to a half of the voltage of the voltage source, and therefore, the voltage which is half of the voltage source voltage is outputted from the positive voltage output terminal. During a second phase complementary to the first phase, the capacitors are separated from the voltage source but connected in parallel to each other, so that the voltage of the positive voltage output terminal is maintained at half of the voltage source voltage.

However, this conventional step-down circuit cannot give positive and negative voltages having their absolute value which is a half of the voltage source voltage.

For example, it may be considered to add an inverting circuit which inverts the voltage on the positive voltage output terminal so as to supply a negative voltage having the same magnitude as the voltage of the positive voltage output terminal. This modification can surely give positive and negative output voltages, however, when the voltage of the positive voltage output terminal varies due to influence of an external load, the output voltage of the inverting circuit connected to the positive voltage output terminal correspondingly varies, with the result that an external circuit connected to the inverting circuit may malfunction. In addition, if a voltage supply circuit is composed of the step-down circuit having the added inverting circuit, the voltage variation on the positive voltage output terminal directly becomes the voltage variation on a negative voltage output terminal, and therefore, the voltage variation of the voltage supply circuit is doubled. Accordingly, reliability of the voltage supply circuit remarkably lowers.

(3) Multiphase Clock Generating Circuit

Conventionally, multiphase clock generating circuits have been used with a switching-element containing circuit such as the switched capacitor step-up circuit, the switched capacitor step-down circuit and others, for the purpose of supplying timing clocks to switching elements for switchover between an ON condition and an OFF condition of each switching element. In these cases, in order to ensure that switches to be on-off controlled at different phases are never simultaneously put in the ON condition, it is necessary to use timing clock signals which are different in phase and which never overlap each other. For example, the conventional step-up voltage converting circuit disclosed in FIG. 1A of U.S. Pat. No. 4,777,577 needs a two-phase clock generator. In many cases, in addition, it becomes necessary to control the switching elements with clocks of three or more different phases, and therefore, a multiphase clock generating circuit for generating clocks of three or more different phases must be used.

The conventional multiphase clock generating circuits having the above mentioned functions have required at least one ½ frequency divider composed of for example a D-type flipflop, in order to generate from a single input clock a pair of clock signals that do not overlap each other in phase. Accordingly, in order to generate an N-phase clock, at least N ½ frequency dividers (each composed of a D-type flipflop) are required. This is disadvantageous since the number of necessary elements inevitably becomes large and therefore such a device needs a large chip area when it is implemented in an integrated circuit.

Furthermore, since the multiphase clock is generated by action of the frequency division realized by the flipflops, a clock to be supplied to a multiphase clock generating circuit has to have a sufficiently high frequency. In this connection, a possible 3-phase clock generating circuit mainly composed of flipflops would require an input clock having the frequency which is four times the frequency of each of three clocks of different phases generated by the 3-phase clock generating circuit itself. As a result, a large amount of a pass-through current flows from the voltage source to the ground, and therefore, an amount of consumed electric power is large.

SUMMARY OF THE INVENTION

Accordingly, it is an object of the present invention to provide a voltage converting circuit and a multiphase clock generating circuit each of which has overcome the above mentioned defects of the conventional ones.

Another object of the present invention is to provide a voltage converting circuit configured so that even if an output voltage of one voltage output terminal is caused to vary due to the condition of a load connected to the one voltage output terminal, an output voltage of the other voltage output terminal is maintained stable.

Still another object of the present invention is to provide a voltage converting circuit capable of generating positive and negative voltages having different absolute values.

A further object of the present invention is to provide a multiphase clock generating circuit which can be constructed without a flipflop in an initial stage, and which can therefore be realized with a reduced chip area.

The above and other objects of the present invention are achieved in accordance with the present invention by a voltage converting circuit including a plurality of capacitive elements, means for charging the plurality of capacitive elements with a voltage source voltage at a first timing, means for connecting at least one of the plurality of capacitive elements in series with the voltage source voltage at a second timing so as to generate a positive voltage which is at least two times the voltage source voltage, and means for serially connecting at least two capacitive elements of the plurality of capacitive elements at a third timing so as to generate a negative voltage which is at least two times times the voltage source voltage.

According to another aspect of the present invention, there is provided a voltage converting circuit including a plurality of capacitive elements, means for connecting the plurality of capacitive elements in series with each other and charging the series-connected capacitive elements with a voltage source voltage at a first timing, means for connecting a first predetermined number of capacitive elements of the plurality of capacitive elements in parallel to each other at a second timing so as to generate a positive voltage corresponding to a voltage which is obtained by dividing the voltage source voltage by an integer, and means for connecting a second predetermined number of capacitive elements of the plurality of capacitive elements in parallel to each other at a third timing so as to generate a negative voltage corresponding to a voltage which is obtained by dividing the voltage source voltage by an integer.

According to still another aspect of the present invention, there is provided a multiphase clock generating circuit including a 2-phase clock generating circuit composed of a CMOS level shift circuit having a predetermined delay time and receiving a input clock and generating a non-inverted output clock and an inverted output clock of different phases, and pulse selection means receiving one of the non-inverted output clock and the inverted output clock and generating a plurality of output signals which have a phase different from each other and which has a frequency obtained by dividing the frequency of the received clock by the number of the output signals.

The above and other objects, features and advantages of the present invention will be apparent from the following description of preferred embodiments of the invention with reference to the accompanying drawings.

DESCRIPTION OF THE PREFERRED EMBODIMENTS

Figure 1:
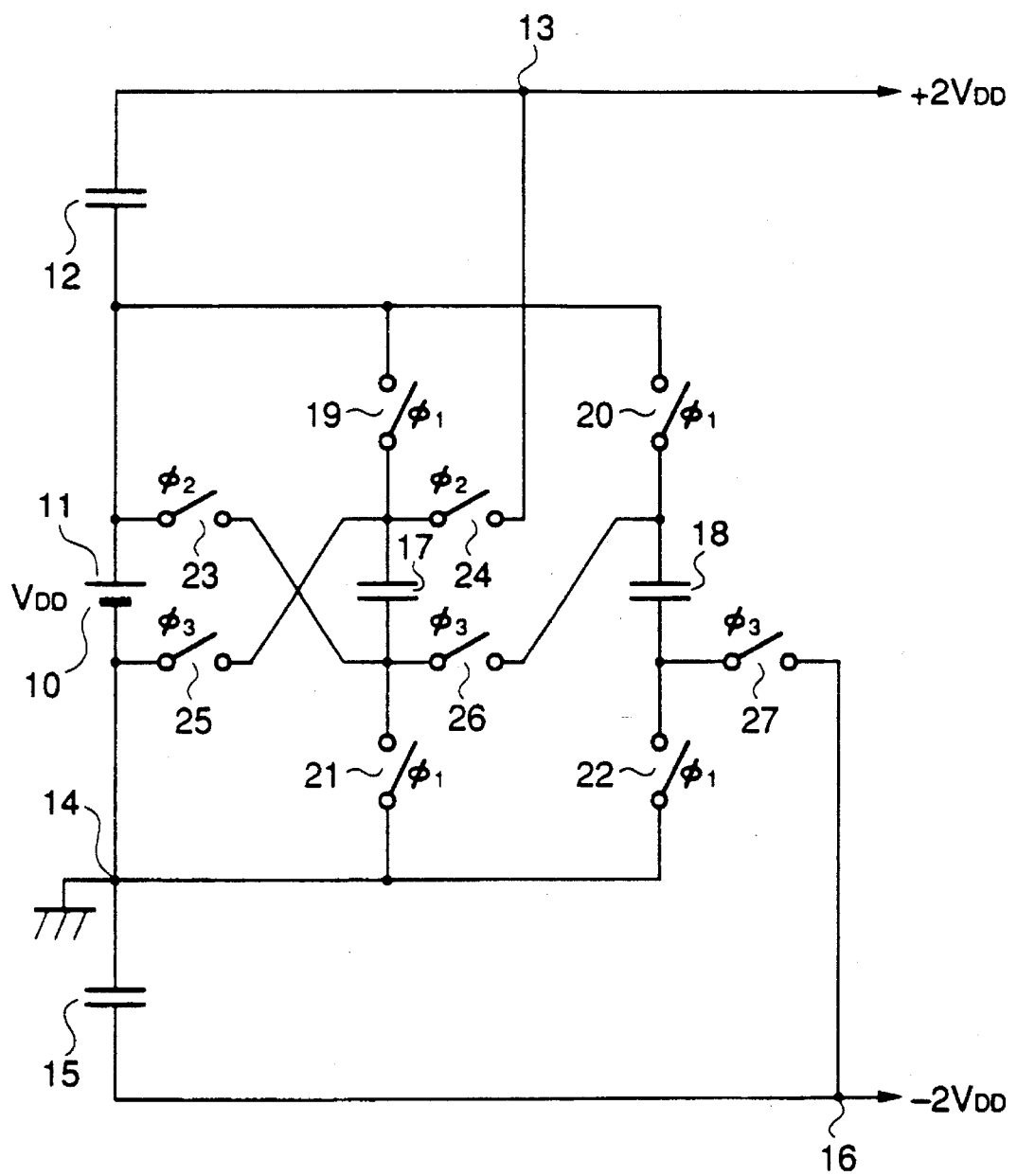
FIG. 1 is a circuit diagram of a first embodiment of the step-up circuit in accordance with the present invention.

Referring to FIG. 1, there is shown a circuit diagram of a first embodiment of the step-up circuit in accordance with the present invention.

The shown step-up circuit includes a voltage source 10 having its negative electrode connected to a ground terminal 14 and its positive electrode 11 Connected to one end of each of a positive reservoir capacitor 12, charging switches 19 and 20 and a positive step-up switch 23. The other end of the positive reservoir capacitor 12 is connected to a positive voltage output terminal 13 and one end of a positive step-up switch 24. The other end of the charging switch 19 is connected to the other end of the positive step-up switch 24, one end of a transfer capacitor 17 and one end of a negative step-up switch 25, which in turn has its other end connected to the ground terminal 14. The other end of the charging switch 20 is connected to one end of a transfer capacitor 18 and one end of a negative step-up switch 26. The other end of the positive step-up switch 23 is connected to the other end of the transfer capacitor 17, the other end of the negative step-up switch 26 and one end of a charging switch 21, which in turn has its other end connected to the ground terminal 14. The other end of the transfer capacitor 18 is connected to one end of a negative step-up switch 27 and one end of a charging switch 22, which in turn has its other end connected to the ground terminal 14. The other end of the negative step-up switch 27 is connected to a negative voltage output terminal 16 and one end of a negative reservoir capacitor 15, which in turn has its other end connected to the ground terminal 14.

In addition, the charging switches 19, 20, 21 and 22, the positive step-up switches 23 and 24, and the negative step-up switches 25, 26 and 27 are controlled by different timing signals 01,02 and 03, respectively, which are generated by a 3-phase clock generating circuit (not shown in FIG. 1).

Now, operation will be described with reference to FIGS. 2A to 2D, which illustrate four different circuit conditions of the step-up circuit shown in FIG. 1 when the timing signals are activated in the order of $\phi_1$, $\phi_2$, $\phi_1$ and 100 $_3$. Here, it is assumed that the charging switches 19, 20, 21 and 22 are closed only during an active or high level period of the corresponding timing signals $\phi_1$, and maintained in an open condition during an inactive or low level period of the corresponding timing signals $\phi_1$, and the positive step-up switches 23 and 24 are closed only during an active or high level period of the corresponding timing signals $\phi_2$, and maintained in an open condition during an inactive or low level period of the corresponding timing signals $\phi_2$. In addition, the negative step-up switches 25, 26 and 27 are closed only during an active or high level period of the corresponding timing signals $\phi_3$, and maintained in an open condition during an inactive or low level period of the corresponding timing signals $\phi_3$. The active or high level period of the timing signals $\phi_1$, $\phi_2$ and $\phi_3$ never overlap each other in time, and the timing signals $\phi_1$, $\phi_2$ and $\phi_3$ are sequentially brought to the high level in the order of $\phi_1$, $\phi_2$, $\phi_1$ and $\phi_3$. One sequence of timing signals $\phi_1$, $\phi_2$, $\phi_1$ and $\phi_3$ constitute one cycle as a basic unit of a repeated operation.

Figure 2A:
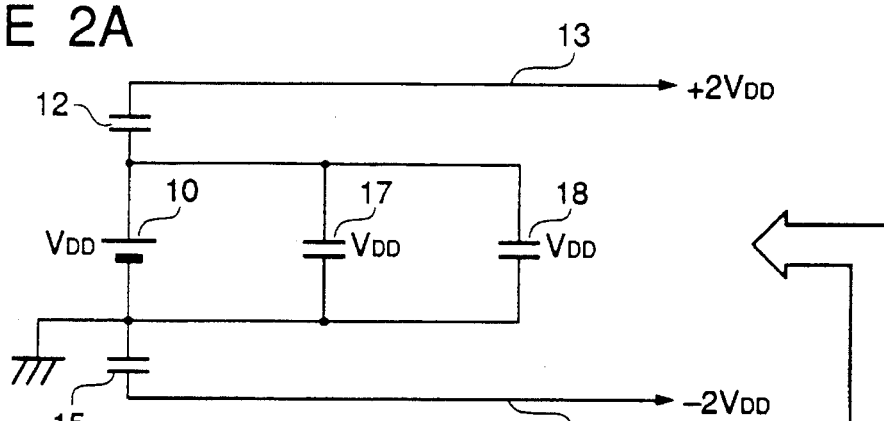
FIGS. 2A to 2D are circuit diagrams illustrating a step-up operation of the step-up circuit shown in FIG. 1.

When the positive step-up switches 23 and 24 and the negative step-up switches 25, 26 and 27 are open or off, the charging switches 19, 20, 21 and 22 are closed or turned on in response to the high level timing signal $\phi_1$. In this condition, as shown in FIG. 2A, the transfer capacitors 17 and 18 are connected in parallel to each other between the positive electrode 11 of the voltage source 10 and the ground terminal 14, and therefore, are charged to a voltage $V_{DD}$ of the voltage source 10.

Figure 2B:
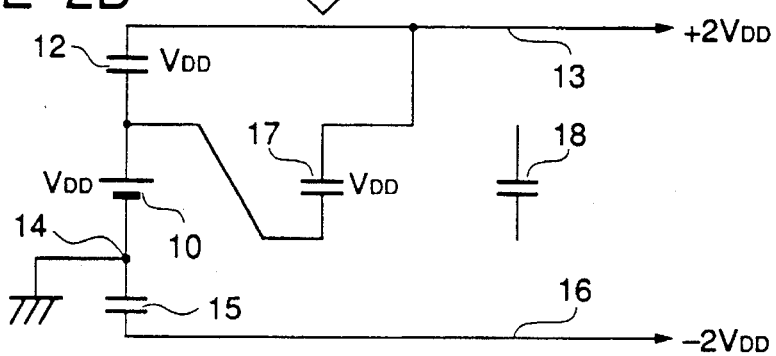

Then, after the charging switches 19, 20, 21 and 22 are rendered open or turned off, only the positive step-up switches 23 and 24 are closed or turned on in response to the high level timing signal $\phi_2$. In this condition, as shown in FIG. 2B, the transfer capacitor 17 is connected between the positive electrode 11 of the voltage source 10 and the positive voltage output terminal 13, and also connected in parallel to the positive reservoir capacitor 12, so that an output voltage of $2V_{DD}$ is supplied from the positive voltage output terminal 13, and the positive reservoir capacitor 12 is charged to $V_{DD}$.

Figure 2C:
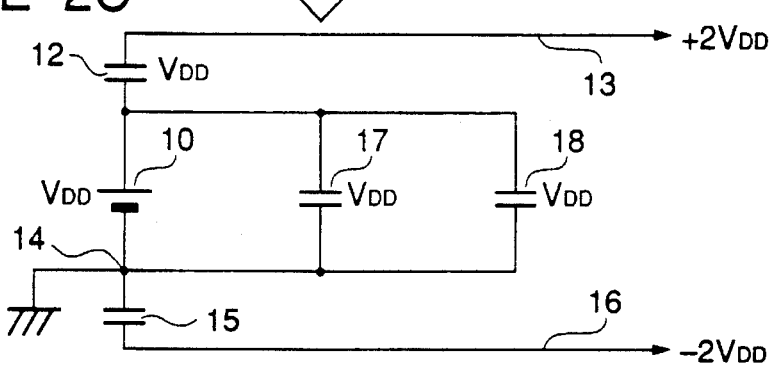

Next, after the positive step-up switches 23 and 24 are rendered open or off, the charging switches 19, 20, 21 and 22 are turned on again in response to the high level timing signal $\phi_1$. In this condition, as shown in FIG. 2C, the transfer capacitors 17 and 18 are charged to the voltage source voltage $V_{DD}$. At this time, since the positive reservoir capacitor 12 and the voltage source 10 are connected in series between the positive voltage output terminal 1.3 and the ground terminal 14, the output voltage of $2V_{DD}$ is supplied from the positive voltage output terminal 13.

Furthermore, after the charging switches 19, 20, 21 and 22 are turned off, only the negative step-up switches 25, 26 and 27 are closed or turned on in response to the high level timing signal $\phi_3$. In this condition, as shown in FIG. 2D, the transfer capacitors 17 and 18 are connected in series between the ground terminal 14 and the negative voltage output terminal 16, and also connected in parallel to the negative reservoir capacitor 15, so that an output voltage of $-2V_{DD}$ is supplied from the negative voltage output terminal 16, and the negative reservoir capacitor 15 is charged to $-2V_{DD}$.

At this time, the output voltage of $2V_{DD}$ is continuously supplied from the positive voltage output terminal 13 by the series-connected positive reservoir capacitor 12 and voltage source 10.

Figure 2D:
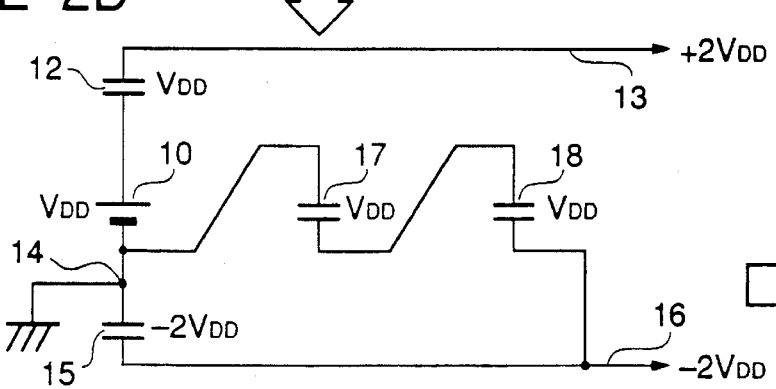

In the connection condition shown in FIGS. 2A, 2C and 2D, there is possibility that the voltage of the positive reservoir capacitor 12 is caused to change due to an external load connected to the positive voltage output terminal 13, and therefore, the positive output voltage varies.

However, even if the voltage of the positive reservoir capacitor 12 changed, the transfer capacitor 17 is charged to the voltage source voltage $V_{DD}$ again as shown in FIG. 2A in response to the high level timing signal $\phi_1$ of the next cycle, and the positive reservoir capacitor 12 is charged to $V_{DD}$ again by the $V_{DD}$ charged transfer capacitor 17 as shown in FIG. 2B in response to the high level timing signal $\phi_2$ of the next cycle. Accordingly, the output of the positive voltage output terminal 13 is restored to $2V_{DD}$. In addition, during this $2V_{DD}$ restoring process, the variation in the voltage of the positive voltage output terminal 13 never causes any variation in the voltage of the negative voltage output terminal 16, since the negative reservoir capacitor 15 is isolated from the positive reservoir capacitor 12 and receives no electric charge from the positive reservoir capacitor 12.

Similarly, in the connection condition shown in FIGS. 2A, 2B and 2C, even if the voltage of the negative voltage output terminal 16 varies, the negative output voltage, namely, the negative reservoir capacitor 15 is recovered to $-2V_{DD}$ again by the transfer capacitors 17 and 18 charged to $V_{DD}$, as shown in FIG. 2D. Also in this process, the variation in the voltage of negative voltage output terminal 16 never causes any variation in the voltage of the positive voltage output terminal 13, since the negative reservoir capacitor 15 and the positive reservoir capacitor 12 are isolated from each other in a charge transfer.

Figure 3:
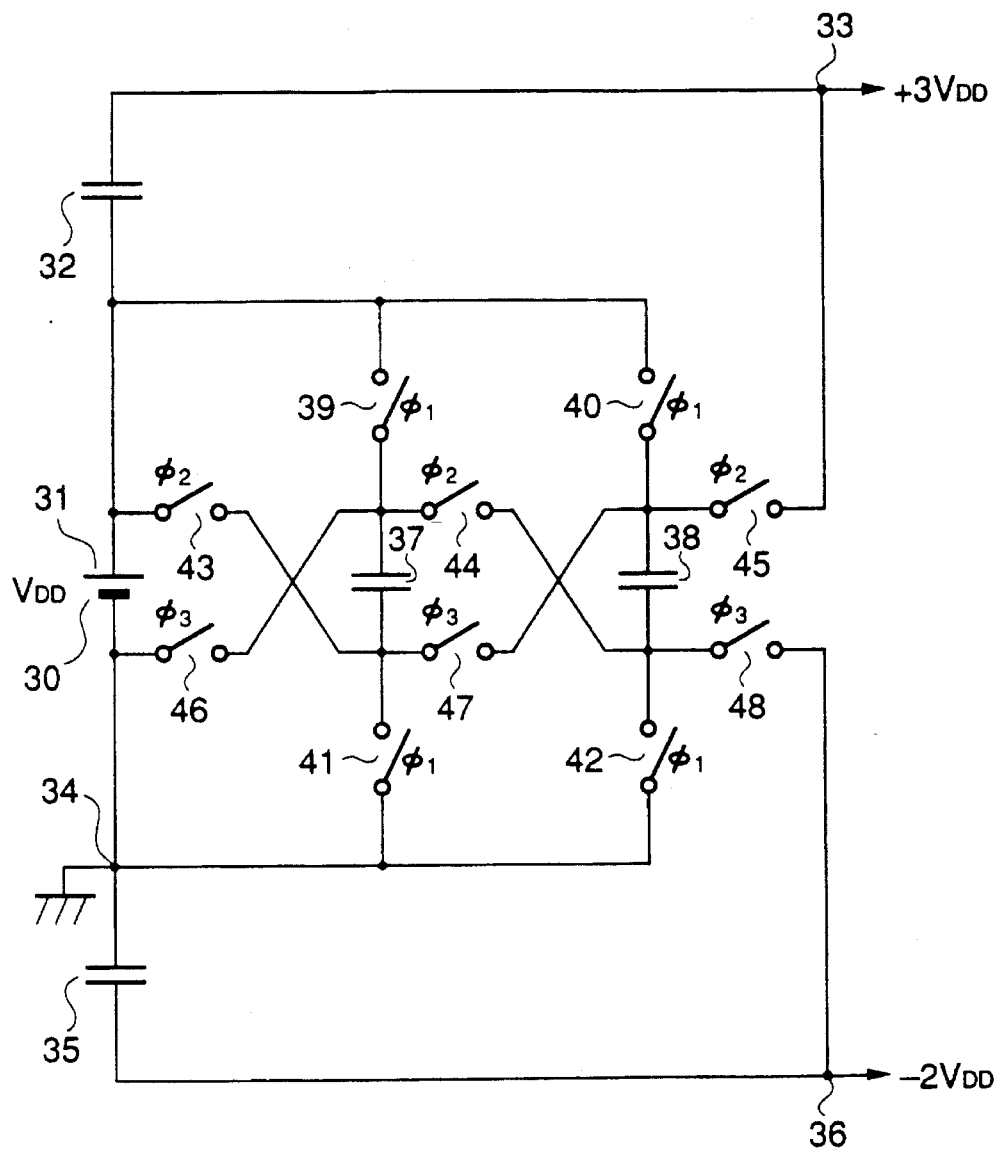
FIG. 3 is a circuit diagram of a second embodiment of the step-up circuit in accordance with the present invention.

Referring to FIG. 3, there is shown a circuit diagram of a second embodiment of the step-up circuit in accordance with the present invention.

The step-up circuit shown in FIG. 3 includes a voltage source 30 having its negative electrode connected to a ground terminal 34. A positive electrode 31 of the voltage source 30 is connected to one end of each of a positive reservoir capacitor 32, charging switches 39 and 40 and a positive step-up switch 43. The other end of the positive reservoir capacitor 32 is connected to a positive voltage output terminal 33 and one end of a positive step-up switch 45. The other end of the charging switch 39 is connected to one end of a positive step-up switch 44, one end of a transfer capacitor 37 and one end of a negative step-up switch 46, which in turn has its other end connected to the ground terminal 34. The other end of the charging switch 40 is connected to one end of a transfer capacitor 38, one end of a negative step,up switch 47, and the other end of the positive step-up switch 45. The other end of the positive step-up switch 43 is connected to the other end of the transfer capacitor 37, the other end of the negative step-up switch 47 and one end of a charging switch 41, which in turn has its other end connected to the ground terminal 34. The other end of the transfer capacitor 38 is connected to the other end of the positive step-up switch 44, one end of a negative step-up switch 48 and one end of a charging switch 42, which in turn has its other end connected to the ground terminal 34. The other end of the negative step-up switch 48 is connected to a negative voltage output terminal 36 and one end of a negative reservoir capacitor 35, which in turn has its other end connected to the ground terminal 34.

In addition, the charging switches 39, 40, 41, and 42, the positive step-up switches 43, 44 and 45, and the negative step-up switches 46, 47 and 48 are controlled by different timing signals $\phi_1 \phi_2$ and $\phi_3$, respectively, similarly to the first embodiment. These timing signals $\phi_1$, $\phi_2$ and $\phi_3$ are generated by a 3-phase clock generating circuit (not shown in FIG. 3).

Now, operation will be described with reference to FIGS. 4A to 4D, which illustrate four different circuit conditions of the step-up circuit shown in FIG. 3 when the timing signals are activated in the order of $\phi_1$, $\phi_2$, $\phi_1$ and $\phi_3$. Here, it is assumed that the charging switches 39, 40, 41 and 42 are closed only during a high level period of the corresponding timing signals $\phi_1$, and maintained in an open condition during a low level period of the corresponding timing signals $\phi_1$, and the positive step-up switches 43, 44 and 45 are closed only during a high level period of the corresponding timing signals $\phi_2$, and maintained in an open condition during a low level period of the corresponding timing signals $\phi_2$. In addition, the negative step-up switches 46, 47 and 48 are closed only during a high level period of the corresponding timing signals $\phi_3$, and maintained in an open condition during a low level period of the corresponding timing signals $\phi_3$. Similarly to the first embodiment, the high level period of the timing signals $\phi_1$, $\phi_2$ and $\phi_3$ never overlap each other in time, and the timing signals $\phi_1$, $\phi_2$ and $\phi_3$ are sequentially brought to the high level in the order of $\phi_1$, $\phi_2 \phi_1$ and $\phi_3$, which constitute one cycle as a basic unit of a repeated operation.

Figure 4A:
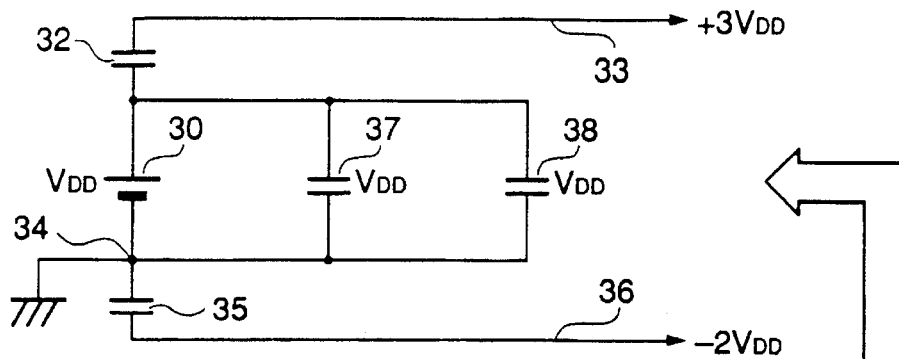
FIGS. 4A to 4D are circuit diagrams illustrating, a step-up operation of the step-up circuit shown in FIG. 3.

When the positive step-up switches 43, 44 and 45 and the negative step-up switches 46, 47 and 48 are open or off, the charging switches 39, 40, 41 and 42 are closed or turned on in response to the high level timing signal $\phi_1$. In this condition, as shown in FIG. 4A, the transfer capacitors 37 and 38 are connected in parallel to each other between the positive electrode 31 of the voltage source 30 and the ground terminal 34, and therefore, are charged to a voltage $V_{DD}$ of the voltage source 30.

Figure 4B:
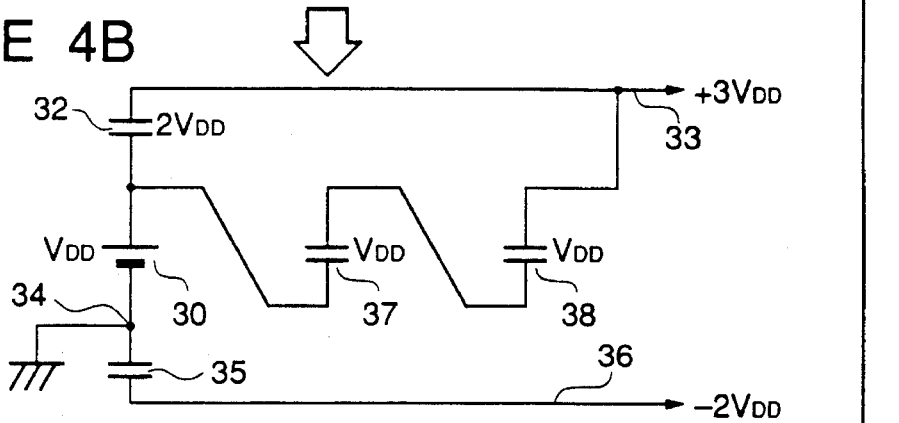

Then, after the charging switches 39, 40, 41 and 42 are turned off, only the positive step-up switches 43, 44 and 44 are closed or turned on in response to the high level timing signal $\phi_2$. In this condition, as shown in FIG. 4B, the transfer capacitors 37 and 38 are connected in series between the positive electrode 31 of the voltage source 30 and the positive voltage output terminal 33, and a series circuit of the transfer capacitors 37 and 38 are connected in parallel to the positive reservoir capacitor 32, so that an output voltage of $3V_{DD}$ is supplied from the positive voltage output terminal 33, and the positive reservoir capacitor 32 is charged to $2V_{DD}$.

Figure 4C:
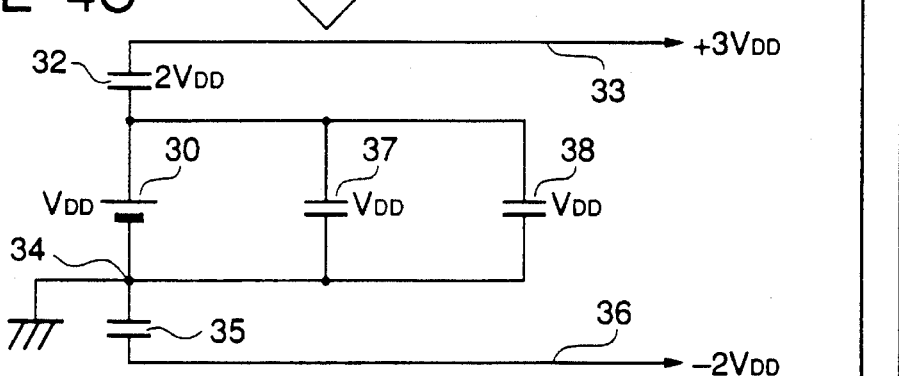

Next, after the positive step-up switches 43, 44 and 45 are rendered open or off, the charging switches 39, 40, 41 and 42 are turned on again in response to the high level timing signal $\phi_1$. In this condition, as shown in FIG. 4C, the transfer capacitors 37 and 38 are charged to the voltage source voltage $V_{DD}$. At this time, since the positive reservoir capacitor 32 and the voltage source 30 are connected in series between the positive voltage output terminal 33 and the ground terminal 34, the output voltage of $3V_{DD}$ is continuously supplied from the positive voltage output terminal 33.

Furthermore, after the charging switches 39, 40, 41 and 42 are turned off, only the negative step-up switches 46, 47 and 48 are closed or turned on in response to the high level timing signal 100 $_3$. In this condition, as shown in FIG. 4D, the transfer capacitors 37 and 38 are connected in series between the ground terminal 34 and the negative voltage output terminal 36, and a series circuit of the transfer capacitors 38 and 37 are connected in parallel to the negative reservoir capacitor 35, so that an output voltage of $-2V_{DD}$ is supplied from the negative voltage output terminal 36, and the negative reservoir capacitor 35 is charged to $-2V_{DD}$.

At this time, the output voltage of $3V_{DD}$ is continuously supplied from the positive voltage output terminal 33 by the series-connected positive reservoir capacitor 32 and voltage source 30.

Figure 4D:
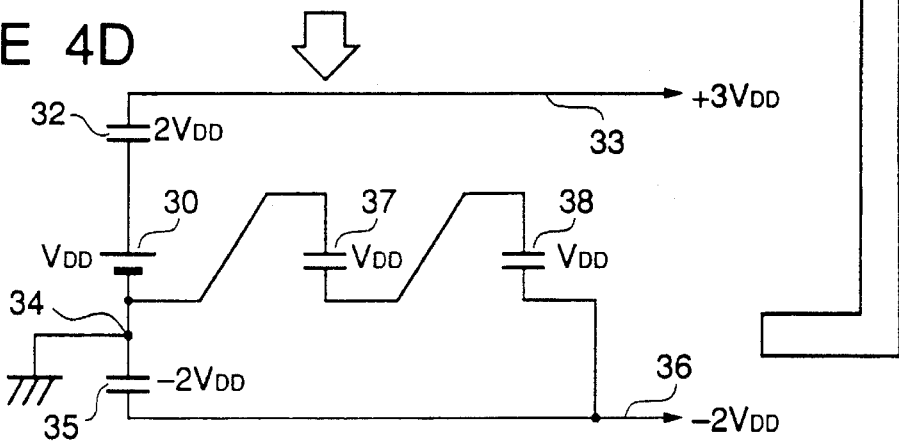

In the connection condition shown in FIGS. 4A, 4C and 4D, there is possibility that the voltage of the positive reservoir capacitor 32 is caused to change due to an external load connected to the positive voltage output terminal 33, and therefore, the positive output voltage varies.

However, even if the voltage of the positive reservoir capacitor 32 changed, the transfer capacitors 37 and 38 are charged to the voltage source voltage $V_{DD}$ again as shown in FIG. 4A in response to the high level timing signal $\phi_1$ of the next cycle, and the positive reservoir capacitor 32 is charged to $2V_{DD}$ again by the $V_{DD}$ charged transfer capacitors 37 and 38 as shown in FIG. 4B in response to the high level timing signal $\phi_2$ of the next cycle. Accordingly, the output of the positive voltage output terminal 33 is restored to $3V_{DD}$. During this $3V_{DD}$ restoring process, the variation in the voltage of the positive voltage output terminal 33 never causes any variation in the voltage of the negative voltage output terminal 36, similarly to the first embodiment.

Similarly, in the connection condition shown in FIGS. 4A, 4B and 4C, even if the voltage of the negative voltage output terminal 36 varies, the negative output voltage, namely, the negative reservoir capacitor 35 is recovered to $-2V_{DD}$ again by the transfer capacitors 37 and 38 charged to $V_{DD}$, as shown in FIG. 4D. In this process, the variation in the voltage of negative voltage output terminal 36 never causes any variation in the voltage of the positive voltage output terminal 33, similarly to the first embodiment.

Furthermore, the second embodiment shown in FIG. 3 outputs the positive output voltage of $+3V_{DD}$ from the positive voltage output terminal 33 and the negative output voltage of $-2V_{DD}$ from the negative voltage output terminal 36. Namely, it is possible to supply positive and negative voltages having different absolute values, from positive and negative voltage output terminals.

Figure 5:
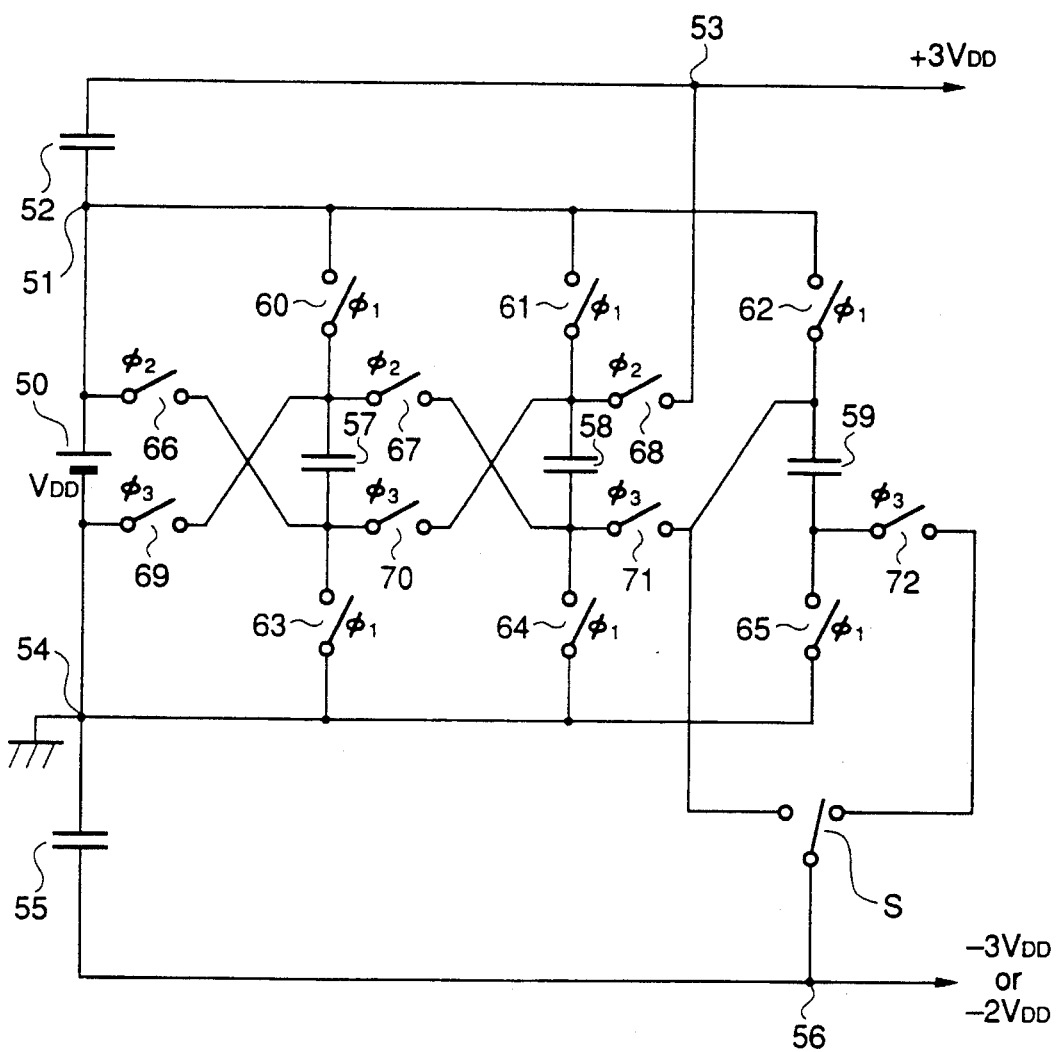
FIG. 5 is a circuit diagram of a third embodiment of the step-up circuit in accordance with the present invention.

Referring to FIG. 5, there is shown a circuit diagram of a third embodiment of the step-up circuit in accordance with the present invention.

This third embodiment includes three transfer capacitors 57, 58 and 59 in order to be able to supply a negative voltage of $-3V_{DD}$.

The embodiment shown in FIG. 5 includes a voltage source 50 having its negative electrode connected to a ground terminal 54. A positive electrode 51 of the voltage source 50 is connected to one end of each of a positive reservoir capacitor 52, charging switches 60, 61 and 62 and a positive step-up switch 66. The other end of the positive reservoir capacitor 52 is connected to a positive voltage output terminal 53 and one end of a positive step-up switch 68. The other end of the charging switch 60 is connected to one end of a positive step-up switch 67, one end of a transfer capacitor 57 and one end of a negative step-up switch 69, which in turn has its other end connected to the ground terminal 54. The other end of the charging switch 61 is connected to the other end of the positive step-up switch 68, one end of a transfer capacitor 58 and one end of a negative step-up switch 70. The other end of the charging switch 62 is connected to one end of a transfer capacitor 59 and one end of a negative step-up switch 71.

The other end of the positive step-up switch 66 is connected to the other end of the transfer capacitor 57, the other end of the negative step-up switch 70 and one end of a charging switch 63, which in turn has its other end connected to the ground terminal 54. The other end of the positive step-up switch 67 is connected to the other end of the transfer capacitor 58, the other end of the negative step-up switch 71 and one end of a charging switch 64, which in turn has its other end connected to the ground terminal 54. The other end of the transfer capacitor 59 is connected to one end of a negative step-up switch 72 and one end of a charging switch 65, which in turn has its other end connected to the ground terminal 54. The other end of the negative step-up switch 72 is connected to one selection input of a selection switch S, which has its other selection input connected to the one end of the negative step-up switch 71. A selection output of the switch S is connected to a negative voltage output terminal 56 and one end of a negative reservoir capacitor 55, which in turn has its other end connected to the ground terminal 54.

In addition, the charging switches 60, 61, 62, 63, 64 and 65, the positive step-up switches 66, 67 and 68, and the negative step-up switches 69, 70, 71 and 72 are controlled by different timing signals $\phi_1$, $\phi_2$ and $\phi_3$, which are similar to those timing signals in the first and second embodiments. In other words, the third embodiment is operated in a manner similar to those of the first and second embodiments, and therefore, a detailed explanation of the operation of the third embodiment will be omitted.

With the arrangement of the third embodiment, a positive output voltage of $+3V_{DD}$ is obtained by cooperation of the voltage source 50 and the transfer capacitors 57 and 58, and supplied from the positive voltage output terminal 53. In addition, a negative output voltage of $-2V_{DD}$ is obtained by cooperation of the transfer capacitors 57 and 58, and a negative output voltage of $-3V_{DD}$ is obtained by cooperation of the transfer capacitors 57, 58 and 59. Either the negative output voltage of $-2V_{DD}$ or the negative output voltage of $-3V_{DD}$ is selected by the switch S, and supplied from the negative voltage output terminal 56.

In this third embodiment, positive and negative voltages having the same absolute value or positive and negative voltages having different absolute values can be selectively obtained from the positive voltage output terminal 53 and the negative voltage output terminal 56, by controlling the switch S. A voltage variation on one of the positive and negative voltage output terminals 53 and 56 caused by an external load causes no voltage variation on the other of the positive and negative voltage output terminals 53 and 56, similarly to the first and second embodiments.

Figure 6:
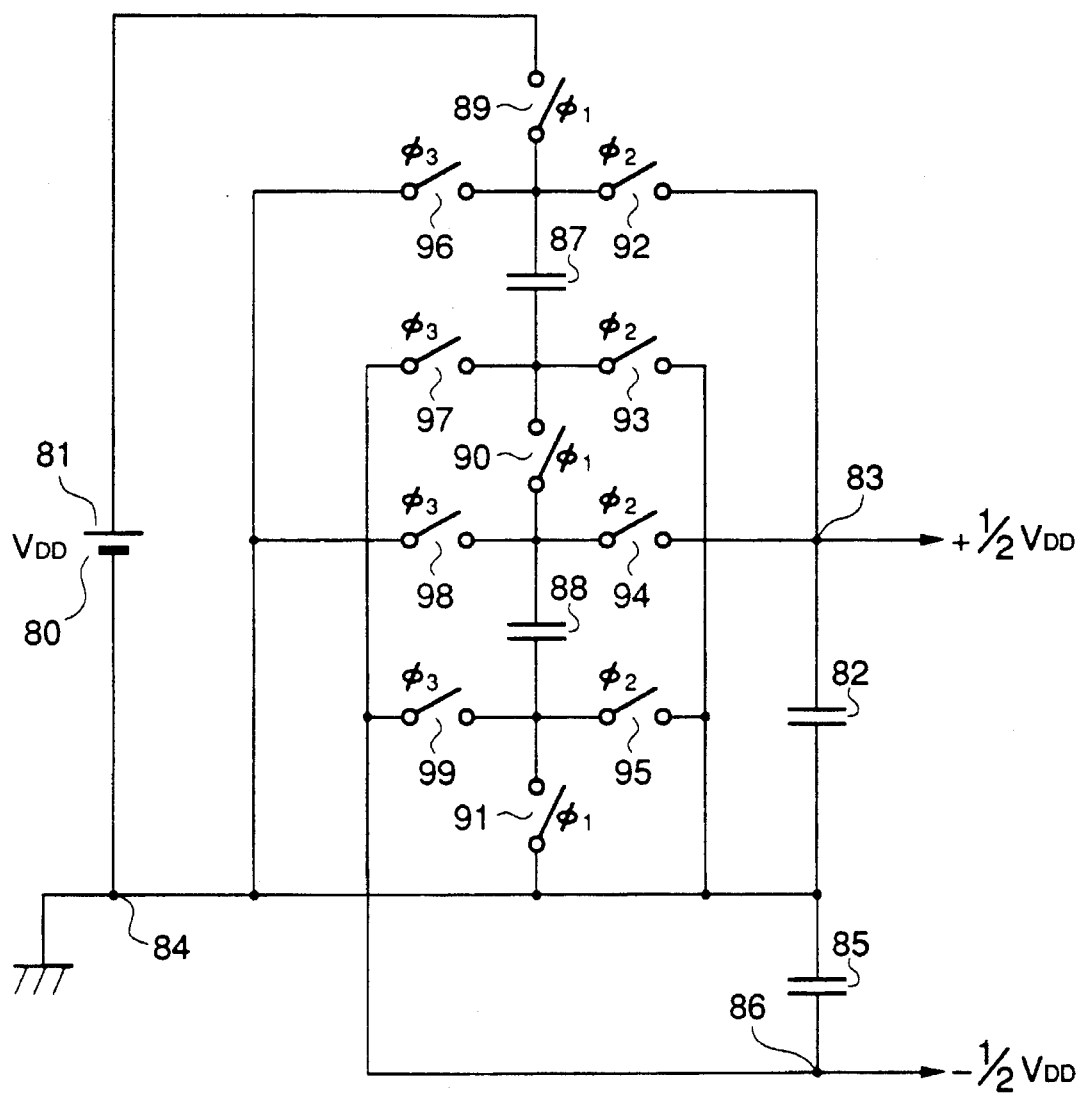
FIG. 6 is a circuit diagram of a first embodiment of the step-down circuit in accordance with the present invention.

Referring to FIG. 6, there is shown a circuit diagram of a first embodiment of the step-down circuit in accordance with the present invention.

The step-down circuit shown in FIG. 6 includes a voltage source 80 having its negative electrode connected to a ground terminal 84 and its positive electrode 81 connected to one end of a charging switch 89. The other end of the charging switch 89 is connected to one end of a transfer capacitor 87, one end of a positive step-down switch 92, and one end of a negative step-down switch 96 having its other end connected to the ground terminal 84. The other end of the positive step-down switch 92 is connected to a positive voltage output terminal 83, one end of a positive step-down switch 94, and one end of a positive reservoir capacitor 82 having its other end connected to the ground terminal 84.

The other end of the transfer capacitor 87 is connected to one end of a charging switch 90, one end of a negative step-down switch 97 and one end of a positive step-down switch 93 having its other end connected to the ground terminal 84. The other end of the charging switch 90 is connected to the other end of the positive step-down switch 94, one end of another transfer capacitor 88, and one end of a negative step-down switch 98 having its other end connected to the ground terminal 84. The other end of the negative step-down switch 97 is connected to one end of a negative step-down switch 99, a negative voltage output terminal 86 and one end of a negative reservoir capacitor 85 having its other end connected to the ground terminal 84. The other end of the negative step-down switch 99 is connected to the other end of the transfer capacitor 88, one end of a positive step-down switch 95 and one end of a charging switch 91. The other end of each of the positive step-down switch 95 and the charging switch 91 is connected to the ground terminal 84.

In addition, the charging switches 89, 90 and 91, the positive step-down switches 92, 93, 94 and 95, and the negative step-down switches 96, 97, 98 and 99 are controlled by different timing signals $\phi_2$ and $\phi_3$, respectively, which are similar to the timing signals in the first to third embodiments of the step-up circuit.

Now, operation will be described with reference to FIGS. 7A to 7D, which illustrate four different circuit conditions of the step-down circuit shown in FIG. 6 when the timing signals are activated in the order of $\phi_1$, $\phi_2$, $\phi_1$ and $\phi_3$. Here, it is assumed that the charging switches 89, 90 and 91 are closed only during a high level period of the corresponding timing signals $\phi_1$, and maintained in an open condition during an inactive or low level period of the corresponding timing signals $\phi_1$, and the positive step-down switches 92, 93, 94 and 95 are closed only during a high level period of the corresponding timing signals $\phi_2$, and maintained in an open condition during a low level period of the corresponding timing signals $\phi_2$. In addition, the negative step-down switches 96, 97, 98 and 99 are closed only during a high level period of the corresponding timing signals $\phi_3$, and maintained in an open condition during a low level period of the corresponding timing signals $\phi_3$. Similarly to the timing signals in the first to third embodiments of the step-up circuit, the high level period of the timing signals $\phi_1$, $\phi_{2\ and}$ $\phi_3$ never overlap each other in time, and the timing signals $\phi_1$, $\phi_2$ and $\phi_3$ are sequentially brought to the high level in the order of $\phi_1$, $\phi_{2,\ \phi 1}$ and $\phi_3$. One sequence of timing signals $\phi_1$, $\phi_{2,\ \phi 1}$ and $\phi_3$ constitute one cycle as a basic unit of a repeated operation.

Figure 7A:
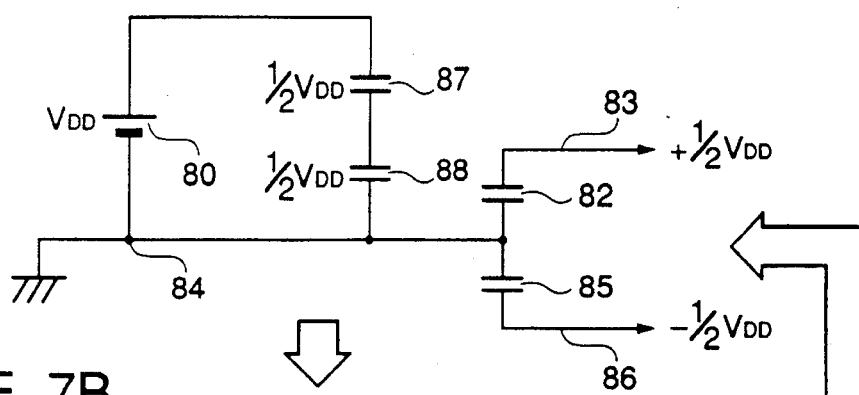
FIGS. 7A to 7D are circuit diagrams illustrating a step-down operation of the step-down circuit shown in FIG. 6.

When the positive step-down switches 92, 93, 94 and 95 and negative step-down switches 96, 97, 98 and 99 are open or off, the charging switches 89, 90 and 91 are closed or turned on in response to the high level timing signal $\phi_1$. In this condition, as shown in FIG. 7A, the transfer capacitors 87 and 88 are connected in series between the positive electrode 81 of the voltage source 80 and the ground terminal 84. Since the transfer capacitors 87 and 88 have the same capacitance, each of the transfer capacitors 87 and 88 is charged to a half of a voltage $V_{DD}$ Of the voltage source 80, namely, $V_{DD}/2$.

Figure 7B:
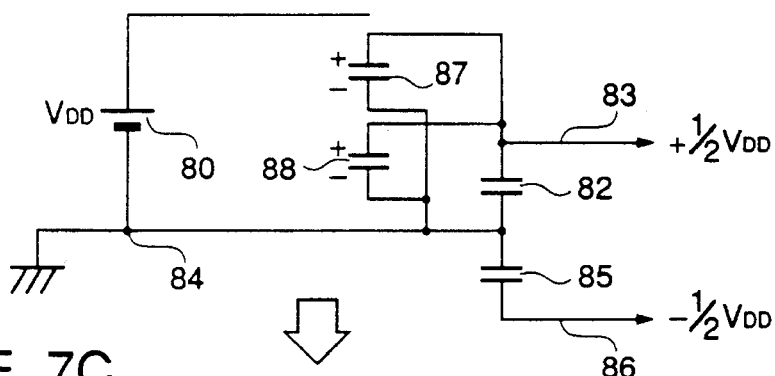

Then, after the charging switches 89, 90 and 91 are rendered open or turned off, only the positive step-down switches 92, 93, 94 and 95 are closed or turned on in response to the high level timing signal $\phi_2$. In this condition, as shown in FIG. 7B, the transfer capacitors 87 and 88 are connected in parallel to the positive reservoir capacitor 82, and also connected in parallel between the positive voltage output terminal 83 and the ground terminal 84, so that the positive reservoir capacitor 82 is charged to $V_{DD}/2$, and an output voltage of $V_{DD}/2$ is supplied from the positive voltage output terminal 83.

Figure 7C:
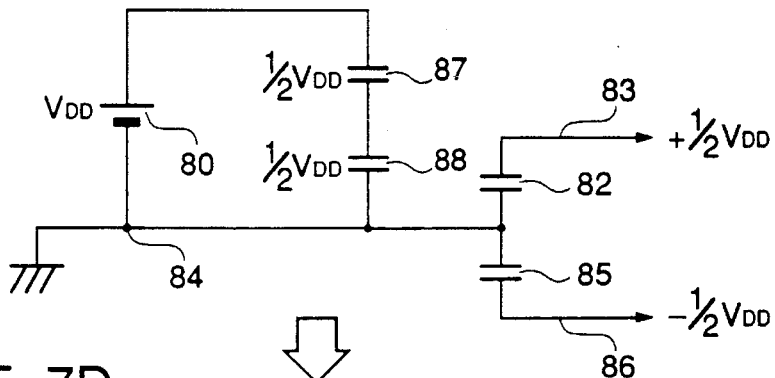

Next, after the positive step-down switches 92, 93, 94 and 95 are rendered open or off, the charging switches 89, 90 and 91 are turned on again in response to the high level timing signal $\phi_1$. In this condition, as shown in FIG. 7C, the transfer capacitors 87 and 88 are charged to the voltage of $V_{DD}/2$. At this time, since the positive reservoir capacitor 82 is connected in series between the positive voltage output terminal 83 and the ground terminal 84, the output voltage of $V_{DD}/2$ is continuously supplied from the positive voltage output terminal 83.

Figure 7D:
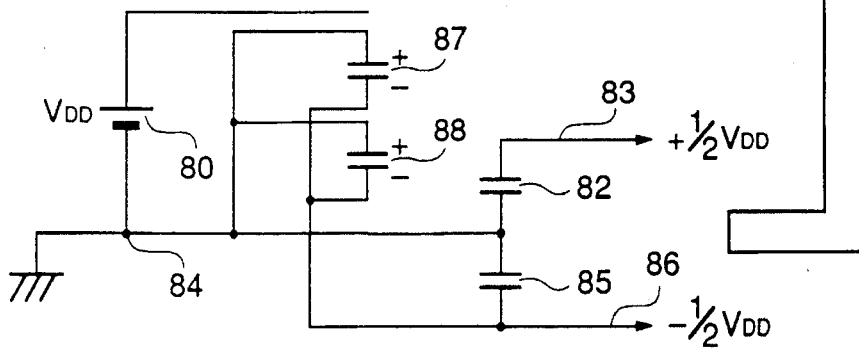

Furthermore, after the charging switches 89, 90 and 91 are turned off, only the negative step-down switches 96, 97, 98 and 99 are closed or turned on in response to the high level timing signal $\phi 3$. In this condition, as shown in FIG. 7D, each of the transfer capacitors 87 and 88 is connected in parallel to the negative reservoir capacitor 85, and also connected between the ground terminal 84 and the negative voltage output terminal 86, so that the negative reservoir capacitor 85 is charged to $-V_{DD}/2$, and an output voltage of $-V_{DD}/2$ is supplied from the negative voltage output terminal 86. At this time, the output voltage of $V_{DD}/2$ is continuously supplied from the positive voltage output terminal 83 by the positive reservoir capacitor 82.

In the connection condition shown in FIGS. 7A, 7C and 7D, there is possibility that the voltage of the positive reservoir capacitor 82 is caused to change due to an external load connected to the positive voltage output terminal 83, and therefore, the positive output voltage varies.

However, even if the voltage of the positive reservoir capacitor 82 changed, the transfer capacitors 87 and 88 are charged to the voltage source voltage $V_{DD}/2$ again as shown in FIG. 7A in response to the high level timing signal $\phi_1$ of the next cycle, and the positive reservoir capacitor 82 is charged to $V_{DD}/2$ again by the charged transfer capacitors 87 and 88 as shown in FIG. 7B in response to the high level timing signal $\phi_2$ of the next cycle. Accordingly, the output of the positive voltage output terminal 83 is restored to $V_{DD}/2$. In addition, during this voltage restoring process, the variation in the voltage of the positive voltage output terminal 83 never causes any variation in the voltage of the negative voltage output terminal 86, since the negative reservoir capacitor 85 is isolated from the positive reservoir capacitor 82 and receives no electric charge from the positive reservoir capacitor 82.

Similarly, in the connection condition shown in FIGS. 7A, 7B and 7C, even if the voltage of the negative voltage output terminal 86 varies, the negative output voltage, namely, the negative reservoir capacitor 85 is recovered to $-V_{DD}/2$ again by the transfer capacitors 87 and 88 charged to $V_{DD}/2$, as shown in FIG. 7D. Also in this process, the variation in the voltage of negative voltage output terminal 86 never causes any variation in the voltage of the positive voltage output terminal 83, since the negative reservoir capacitor 85 and the positive reservoir capacitor 82 are isolated from each other in a charge transfer.

Figure 8:
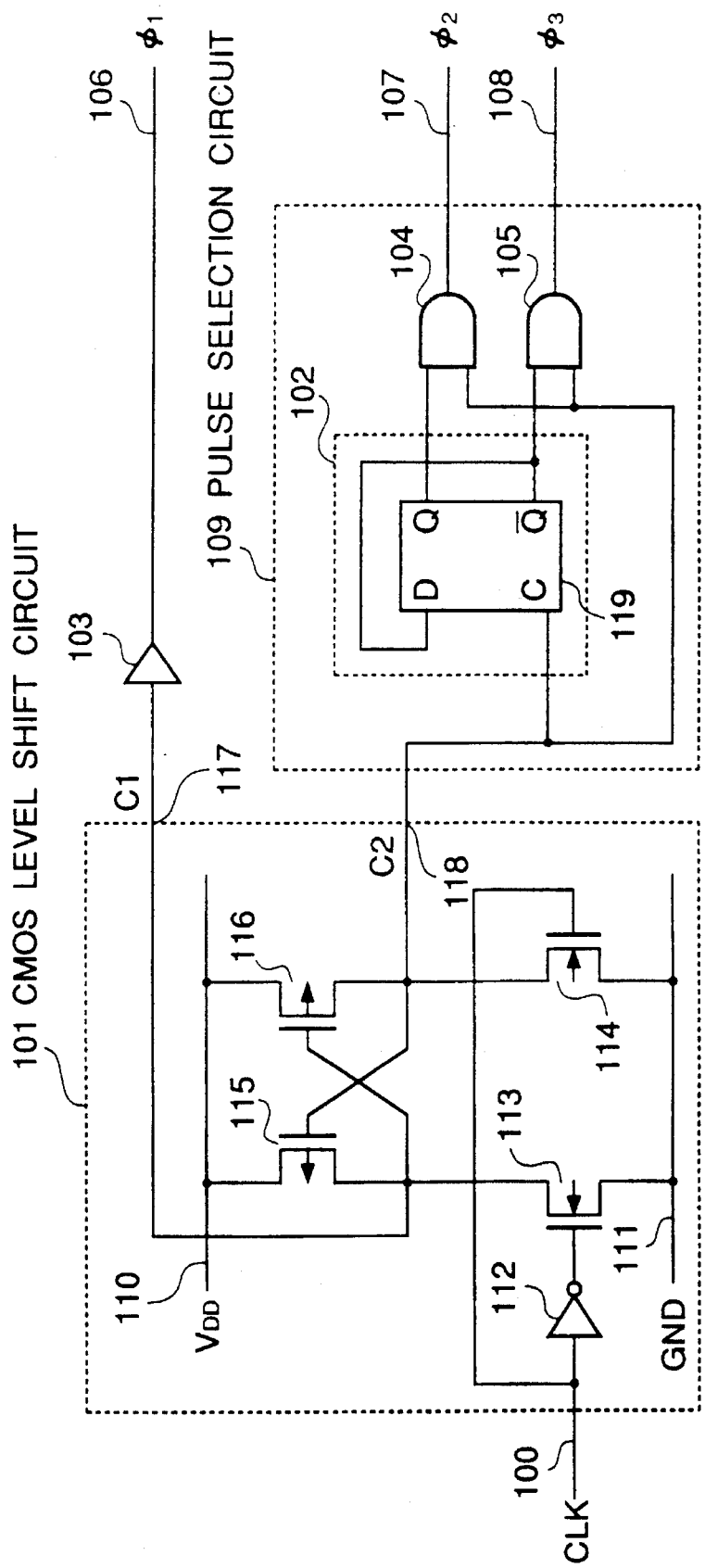
FIG. 8 is a circuit diagram of a first embodiment of the 3-phase clock generating circuit in accordance with the present invention.

Referring to FIG. 8, there is shown a circuit diagram of a first embodiment of the 3-phase clock generating circuit in accordance with the present invention.

The 3-phase clock generating circuit shown in FIG. 8 is mainly composed of a flipflop type CMOS level shift circuit 101, a buffer 103 and a pulse selection circuit 109.

The CMOS level shift circuit 101 includes a clock input terminal 100 connected to an input of an inverter 112 and a gate of an N-channel transistor 114 having its source connected to a ground terminal 111. An output of the inverter 1.12 is connected to a gate of an N-channel transistor 113 having its source connected to the ground terminal 111. A drain of the N-channel transistor 113 is connected to an output terminal 117 of the CMOS level shift circuit 101, a drain of a P-channel transistor 115 and a gate of a P-channel transistor 116. These P-channel transistors 115 and 116 have their source connected in common to a voltage supply terminal 110, $V_{DD}$. A drain of the N-channel transistor 114 is connected to another output terminal 118 of the COMS level shift circuit 101, a gate of the P-channel transistor 115 and a drain of the P-channel transistor 116. The output terminal 117 is connected through the buffer 103 to an output terminal of 106 of the 3-phase clock generating circuit.

The pulse selection circuit 119 includes a D-type flipflop 109 having a clock input C connected to the output terminal 118 of the CMOS level shift circuit 101. A $\overline{Q}$ output of the D-type flipflop 119 is connected to a data input D of the D-type flipflop 119 itself and one input of an AND circuit 105. A Q output of the D-type flipflop 119 is connected to one input of an AND circuit 104. The other input of each of the AND circuits 104 and 105 is connected in common to the clock input C of the D-type flipflop 119. An output of the AND circuits 104 and 105 are connected to output terminals 107 and 108 of the 3-phase clock generating circuit, respectively.

Here, since the $\overline{Q}$ output of the D-type flipflop 119 is connected to the data input D of the D-type flipflop 119 itself, the D-type flipflop 119 constitutes a ½ frequency divider circuit 102.

Figure 9:
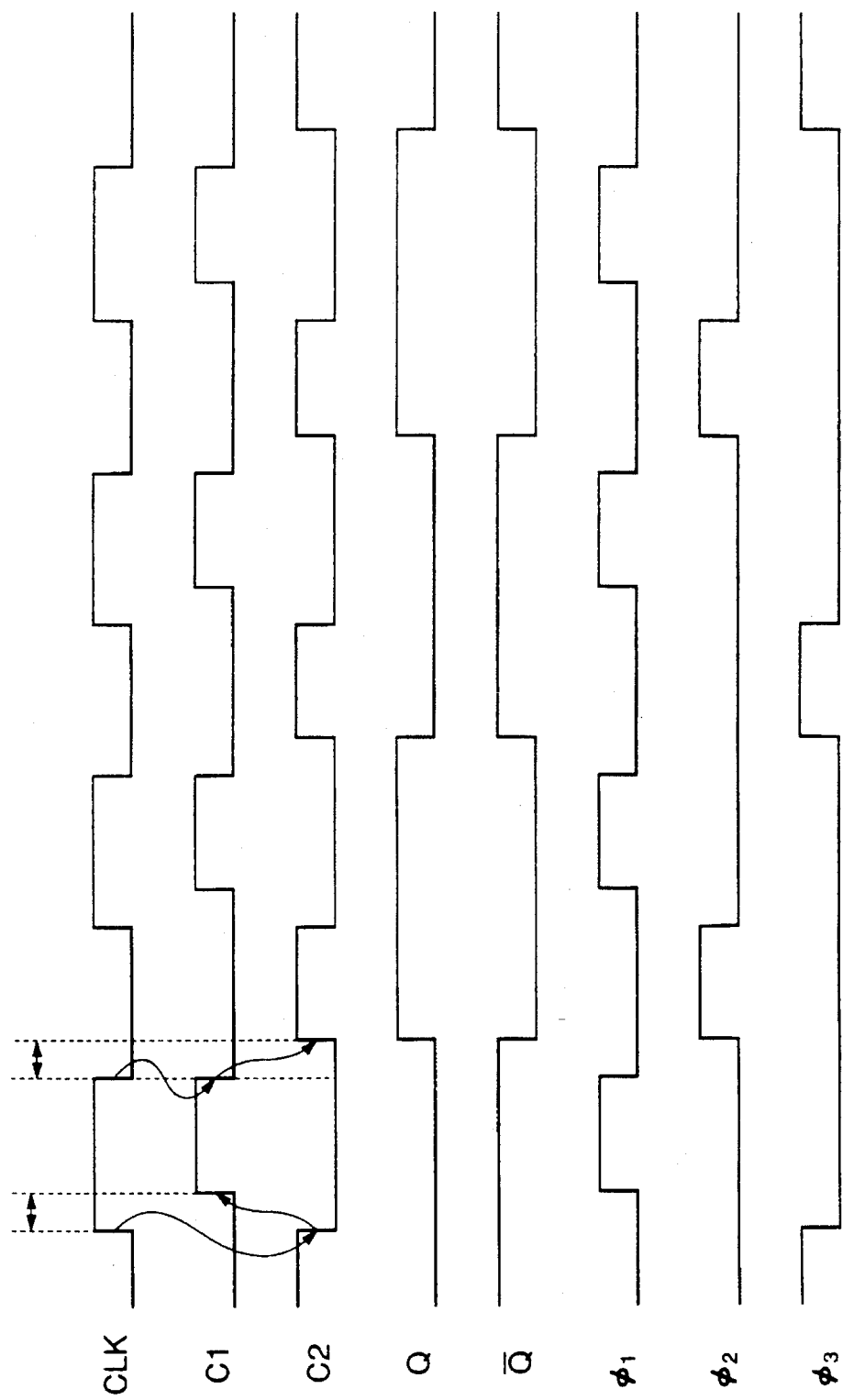
FIG. 9 is a timing chart illustrating an operation of the 3-phase clock generating circuit shown in FIG. 8.

Now, operation of the 3-phase clock generating circuit shown in FIG. 8 will be described with reference to a timing chart of FIG. 9 illustrating an operation of the 3-phase clock generating circuit shown in FIG. 8. FIG. 9 illustrate a change in time of each of the input clock CLK supplied to the clock input terminal 100, a pair of outputs signals C1 and C2 appearing on the output terminals 117 and 118 of the CMOS level shift circuit 101, the Q output and the $\overline{Q}$ output of the D-type flipflop 119, and output signals $\phi_1$, $\phi_2$ and $\phi_3$ appearing on the output terminals 106, 107 and 108.

As shown in FIG. 9, when the input clock CLK is at a low level, the N-channel transistors 113 and 114 are on and off, respectively, and therefore, the output signals C1 and C2 are at a low level and at a high level, respectively. When the input clock CLK changes to the high level, the N-channel transistors 113 and 114 are turned off and on, respectively, and therefore, the output signal C2 becomes the low level. Since the output signal C2 is applied to the gate of the P-channel transistor 115, after the output signal C2 becomes the low level, the P-channel transistor 115 is turned on after a constant delay time which is determined by an ON resistance of the N-channel transistor 114 and a gate capacitance of the P-channel transistor 115. The output signal C1 becomes the high level upon the turning-on of the P-channel transistor 115.

Furthermore, as shown in FIG. 9, when the input clock CLK changes to the low level, the N-channel transistors 113 and 11. 4 are turned on and off, respectively and therefore the output signal C1 becomes the low level. Since the output signal C1 is applied to the gate of the P-channel transistor 116, after the output signal C1 becomes the low level, the P-channel transistor 116 is turned on after a constant delay time which is determined by an ON resistance of the N-channel transistor 113 and a gate capacitance of the P-channel transistor 116. The output signal C2 becomes the high level upon the turning-on of the P-channel transistor 116.

As will be apparent from the above and from FIG. 9, the output signals C1 and C2 constitute two different phase clock signals having a high level period that does not overlap each other.

In this case, the N-channel transistors 113 and 114 are designed to have a current driving capacity larger than that of the P-channel transistors 115 and 116, in order that, in operation, the output signals C1 and C2 of the output terminals 117 and 118 can be surely inverted. For example, when the input clock signal CLK has changed from the low level to the high level, the N-channel transistor 114 is immediately turned on. During the delay time in which the P-channel transistor 116 remains on, the N-channel transistor 114 must flow a current larger than the drain current of the P-channel transistor 116 in order to invert the output signal C2 to the low level. Here, assuming that the input clock signal CLK has an amplitude of 5 V and the voltage $V_{DD}$ of the voltage supply terminal 110 is 10 V, the gate voltage of the N-channel transistor 114 is 5 V at this time, and the gate voltage of the P-channel transistor 116, which is a double of the gate voltage of the N-channel transistor 114. Accordingly, since the current drive capacity of a MOS (metal-oxide-semiconductor) field effect transistor is in proportion to a square of the gate voltage, the gate width/gate length ratio of the N-channel transistor 114 is set to be larger than a value which is four times the gate width/gate length ratio of the P-channel transistor 116. Actually, since mobility of electrons is generally larger than mobility of holes, it is sufficient if the gate width/gate length ratio of the N-channel transistor 114 is four times as larger as the gate width/gate length ratio of the P-channel transistor 116.

The output signal C1 is supplied through the buffer 103 from the output terminal 106, as the output signal $\phi_1$ of the 3-phase clock generating circuit, and the output signal C2 is supplied to the clock input C of the ½ frequency divider circuit 102. In the disclosed embodiment, C1 is chosen as the non-inverted signal and C2 is choosen as the inverted signal. However, those skilled in the art would readily recognized that the converse is equally operable. That is, one may readily construct the system of the present invention having C1 as the inverted signal and C2 as the non-inverted signal. Thus, the Q output of the ½ frequency divider circuit 102 generates the output signal Q which is flipped each time the output signal C2 is brought to the high level. The $\overline{Q}$ output of tile ½ frequency divider circuit 102 generates the output signal $\overline{Q}$ complementary to the output signal Q as shown in FIG. 9. These output signals Q and $\overline{Q}$ are supplied to the AND circuits 104 and 105, respectively, so that the logical product of the output signals Q and $\overline{Q}$ and the output signal C2 are supplied from the output terminals 107 and 108 as the output signals $\phi_2$ and $\phi_3$, respectively.

Accordingly, the clock signals $\phi_1$, $\phi_2$ and $\phi_3$ of different phases having a high level period that never overlap each other, can be obtained from the output terminals 106, 107 and 108. These clock signals are sequentially brought to the high level in the order of $\phi_1$, $\phi_2$, $\phi_1$, and $\phi_3$ in time. The four clock signals $\phi_1$, $\phi_2$, $\phi_1$, and $\phi_3$ constitute one cycle, and therefore, are repeated cyclicly.

The 3-phase clock generating circuit shown in FIG. 8 uses only one ½ frequency divider circuit formed of the D-type flipflop 119, which needs a large chip area. Accordingly, the whole of the 3-phase clock generating circuit shown in FIG. 8 requires only a reduced chip area, and therefore, the 3-phase clock generating circuit shown in FIG. 8 can be easily realized on an integrated circuit.

In addition, the clocks of two different phases that never overlap each other, are generated by utilizing the gate delay time in the CMOS level shift circuit. Therefore, it is not required that the frequency of the input clocks applied to the 3-phase clock generating circuit is sufficiently higher than that of the output clocks of the 3-phase clock generating circuit Namely, as seen from FIG. 9, it is sufficient if the frequency of the input clock signal CLK is a double of the frequency of the output clock signals $\phi_2$ and $\phi_3$ of the 3-phase clock generating circuit. The frequency of the input clock signal CLK is substantially the same as the frequency of the output clock signal $\phi_1$ of the 3-phase clock generating circuit. Accordingly, an oscillator circuit (not shown) for supplying the input clock CLK can be easily constructed. Furthermore, since the input clock CLK does not require a high frequency, the pass-through current flowing through the MOS transistors from the voltage supply terminal to the ground terminal within the 3-phase clock generating circuit, can be remarkably reduced, with the result that the consumed electric power becomes correspondingly small.

The above mentioned embodiment of the multiphase clock generating circuit is of the 3-phase clock generating circuit. However, the multiphase clock generating circuit of four phases of more can be similarly constructed. For example, an additional pulse selection circuit is connected to one of the output terminals of the 3-phase clock generating circuit, so that the additional pulse selection circuit generates two clock signals which never overlap each other and which have a frequency corresponding to a half of the frequency of the output clock outputted form the output terminal of the 3-phase clock generating circuit connected to the additional pulse selection circuit. Thus, a circuit composed of the 3-phase clock generating circuit and the additional pulse selection circuit functions as a four-phase clock generating circuit as a whole. Accordingly, the multiphase clock generating circuit can be constructed by connecting a pulse generating circuit, and the arrangement of the multiphase clock composed of the whole of output pulses can be determined by selecting output terminals of newly added pulse selection circuits.

For example, if an additional pulse selection circuit is connected to the output terminal 108 of the 3-phase clock generating circuit shown in FIG. 8 so that a pair of output signals $\phi_4$ and $\phi_5$ are generated by the additional pulse selection circuit, there can be obtained a four-phase clock generating circuit which generates four different phase clocks $\phi_1$, $\phi_2$, $\phi_4$ and $\phi_5$ which never overlap each other and which are cyclicly brought to the high level in the order of $\phi_1$, $\phi_2$, $\phi_1$, $\phi_4$, $\phi_1$, $\phi_2$, $\phi_1$, and $\phi_5$, which constitute one cycle.

Figure 10:
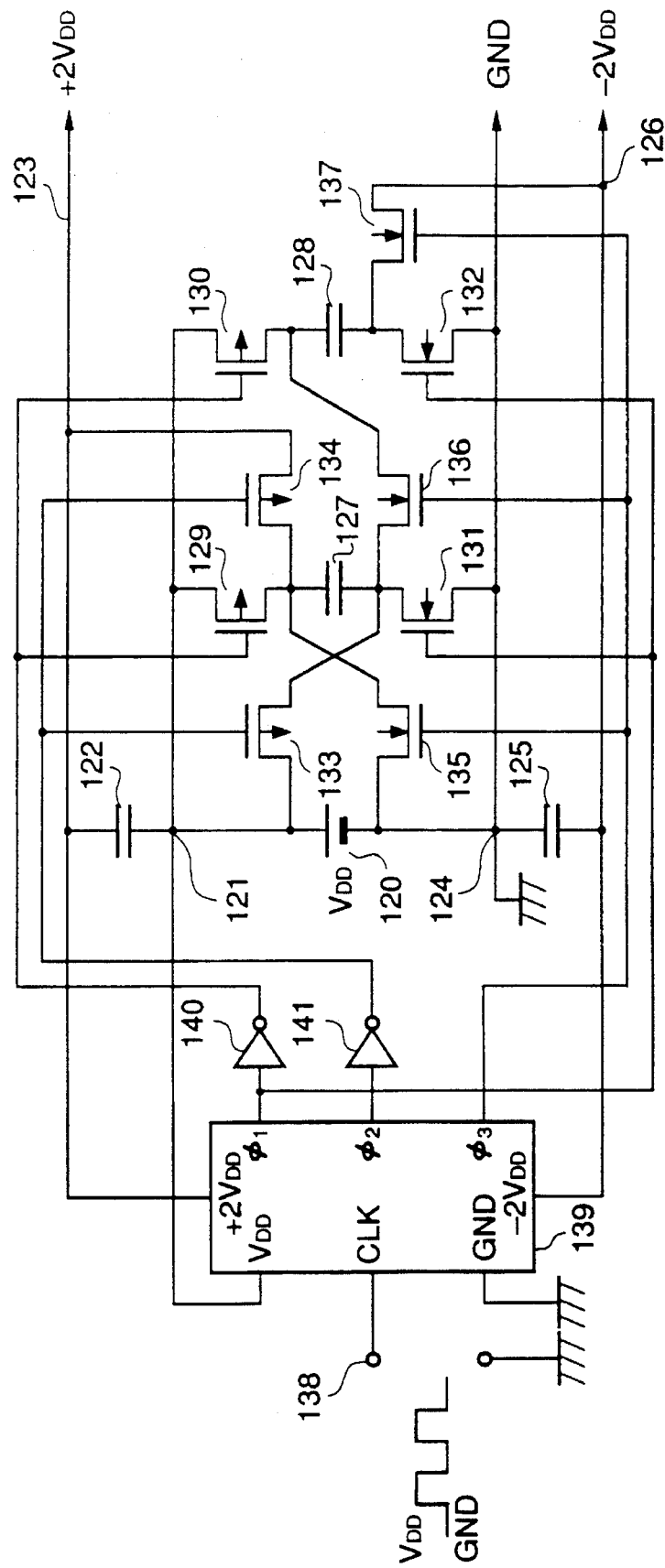
FIG. 10 is a circuit diagram of an embodiment of the step-up circuit in accordance with the present invention associated with the 3-phase clock generating circuit in accordance with the present invention.

Referring to FIG. 10, there is shown a circuit diagram of an embodiment of the step-up circuit in accordance with the present invention associated with the 3-phase clock generating circuit in accordance with the present invention.

The step-up circuit shown in FIG. 10 is the step-up circuit shown in FIG. 1 in which the switches are realized in a CMOS transistor technology. Namely, the positive step-up switches 23 and 24 in the step-up circuit of FIG. 1 are constituted of positive step-up P-channel transistors 133 and 134, respectively. The negative step-up switches 25, 26 and 27 in the step-up circuit of FIG. 1 are constituted of negative step-up N-channel transistors 135, 136 and 137, respectively. The charging switches 19 and 20 are constituted of charging P-channel transistors 129 and 130, respectively. The charging switches 21 and 22 are constituted of charging N-channel transistors 131 and 132, respectively. As show in FIG. 10, respective gates of these N-channel and P-channel transistors are supplied with the timing clock signals $\phi_1$ and $\phi_3$ outputted from a 3-phase clock generating circuit 139 and inverted signals of timing clock signals $\phi_1$ and $\phi_2$ obtained through inverters 140 and 140. In addition, the voltage source 10 and the capacitors 12, 15, 17 and 18 of FIG. 1 correspond to a voltage source 1 20 and capacitors 122, 125,127 and 128 of FIG. 10, respectively. The output terminals 13 and 16 of FIG. 1 correspond to output terminals 123 and 126, respectively.

In the above mentioned step-up circuit shown in FIG. 10, the switches connected to a high level voltage supply terminal 121 or the positive voltage output terminal 123 are formed of the P-channel transistor, and the switches connected to a ground terminal 124 or the negative voltage output terminal 126 are formed of the N-channel transistor. Therefore, since an on resistance of these transistors can be made small by applying a sufficiently large gate voltage, the step-up efficiency can be elevated, and the loss can be decreased with a reduced consumed power.

In addition, the 3-phase clock generating circuit 139 are driven with $2V_{DD}$ and $-2V_{DD}$ as a voltage supply voltage, so that the output timing signals $\phi_1$, $\phi_2$ and $\phi_3$ for switching the N-channel and P-channel transistors have a sufficient amplitude between a positive voltage and a negative voltage.

Figure 11:
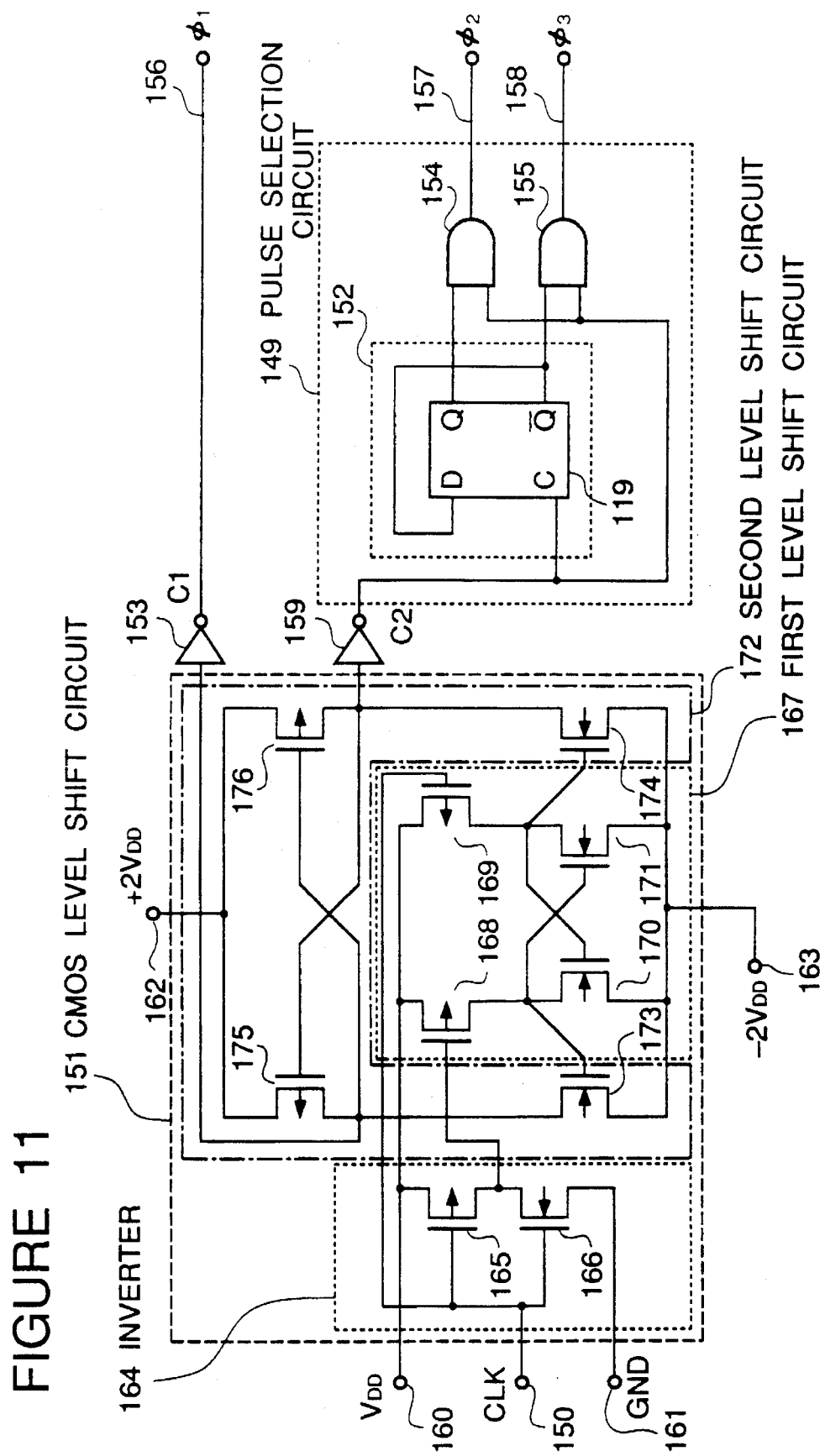
FIG. 11 is a circuit diagram of the 3-phase clock generating circuit used in the embodiment shown in FIG. 10.

Referring to FIG. 11, there is shown a circuit diagram of the 3-phase clock generating circuit 139 used in the embodiment shown in FIG. 10. In this embodiment, it is assumed that $V_{DD}$ is 5 V.

A clock signal CLK having an amplitude from 0 V to 5 V is applied to a clock input terminal 150 corresponding a clock input 138 of FIG. 10. This clock signal CLK is inverted by an inverter 164 composed of a P-channel transistor 165 and an N-channel transistor 166. The clock signal CLK and its inverted signal are supplied to a first level shift circuit 167 which is composed of P-channel transistors 168 and 169 and N-channel transistors 170 and 171 connected as shown in FIG. 11. Namely, the clock signal CLK and its inverted signal are converted into a pair of complementary signals having an amplitude from −10 V to 5 V Furthermore, the pair of complementary signals are supplied to a second level shift circuit 172 which is composed of N-channel transistors 173 and 174 and P-channel transistors 175 and 176 connected as shown in FIG. 11. Namely, the pair of complementary signals are converted into a pair of clock signals having an amplitude from −10 V to +10 V, which are supplied to a pair of inverters 153 and 159, respectively.

An output signal C1 of the inverter 153 is supplied from an output terminal 156 as a first timing signal $\phi_1$. An output signal C2 of the inverter 159 is supplied to a pulse selection circuit 149 constructed similarly to the pulse selection circuit 109 shown in FIG. 8. Thus, second and third signals $\phi_2$ and $\phi_3$ are supplied from output terminals 157 and 158, respectively.

Figure 12:
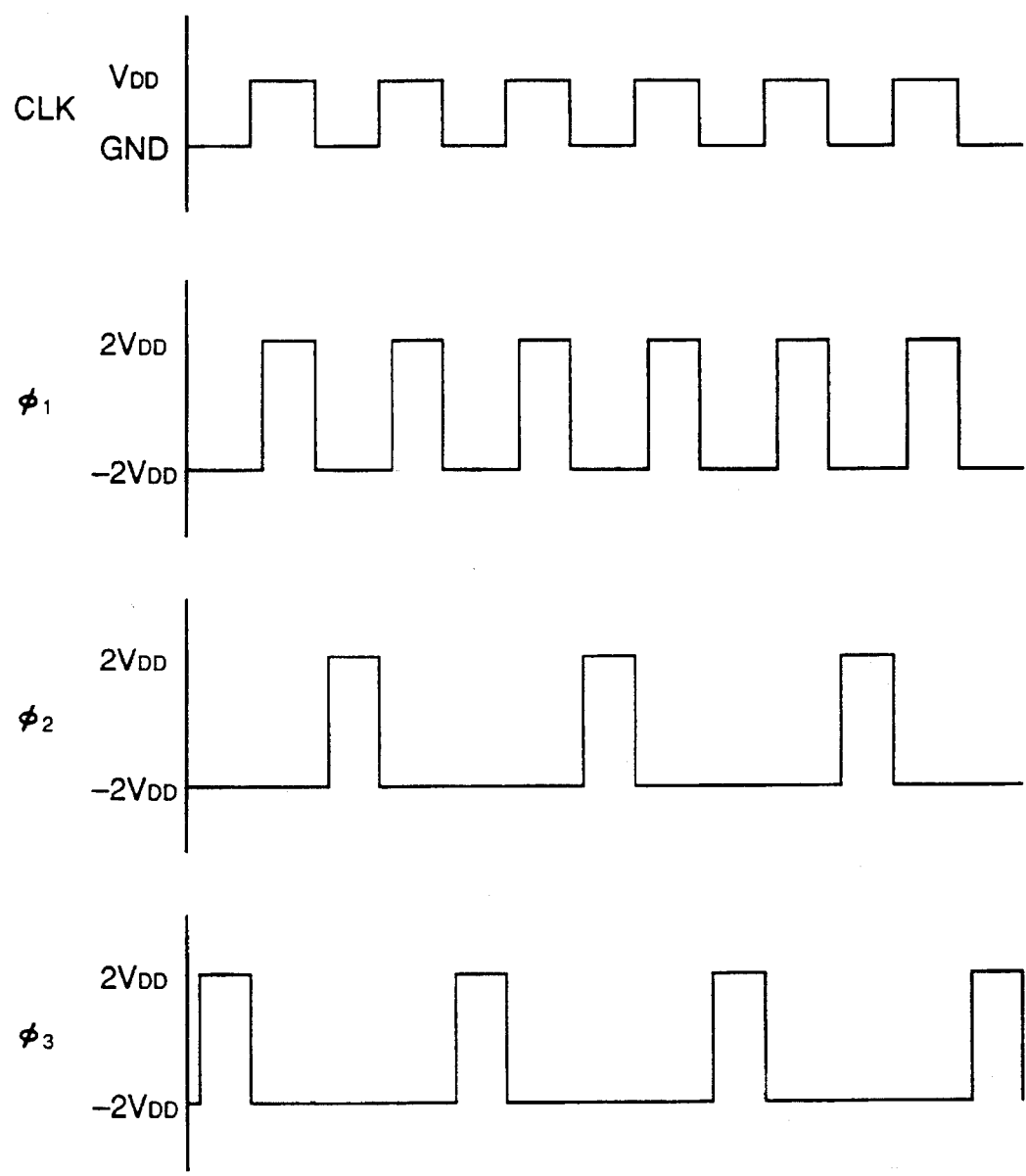
FIG. 12 is a timing chart illustrating an operation of the 3-phase clock generating circuit shown in FIG. 11.

FIG. 12 is a timing chart illustrating the change in time of the input clock CLK and the first, second and third timing signals $\phi_1$, $\phi_2$ and $\phi_3$ in the 3-phase clock generating circuit shown in FIG. 11 .

Since the CMOS level shift circuit 151 is constituted by using two CMOS level shift circuits which are similar to the CMOS level shift circuit used in the 3-phase clock generating circuit of FIG. 8 and which are coupled to form a two-stage cascaded structure, the timing signals having an amplitude from $-2V_{DD}$ to $+2V_{DD}$ can be obtained. Therefore, it is possible to drive the step-up circuit of the CMOS transistor structure shown in FIG. 10.

As will be apparent from the above, the voltage converting circuit in accordance with the present application is configured so that a positive voltage and a negative voltage are generated independently of each other, by using the switches on-off controlled by three different phase clock signals. Accordingly, a voltage variation on one of the positive and negative voltage output terminals caused by an external load causes no voltage variation on the other of the positive and negative voltage output terminals. Therefore, an overall system including the voltage converting circuit in accordance with the present application as a voltage supply circuit, can have an elevated reliability.

In addition, the step-up circuit in accordance with the present application is capable of generating positive and negative voltages having different absolute values. The step-down circuit in accordance with the present application is capable of generating not only a positive voltage but also a negative voltage.

The multiphase clock generating circuit in accordance with the present application is configured so that an initial stage for generating from a single input clock a pair of different phase clocks that do not overlap each other, is constituted of a CMOS level shift circuit, not by the D-type flipflop which needs a large chip area. Accordingly, the whole of the 3-phase clock generating circuit can be realized with a reduced chip area.

In addition, since the input clock signal is not frequency-divided by by a ½ frequency-divider, the frequency of the input clock signal CLK can be set at a low value. This is very effective in reducing the pass-through current and hence the consumed electric power.

The invention has thus been shown and described with reference to the specific embodiments. However, it should be noted that the present invention is in no way limited to the details of the illustrated structures but changes and modifications may be made within the scope of the appended claims.

I claim:

1. A voltage converting circuit including a plurality of capacitive elements, means for connecting said plurality of capacitive elements charging in series with each other and charging the series-connected capacitive elements with a voltage source voltage at a first timing, means for connecting a first predetermined number of capacitive elements of said plurality of capacitive elements in parallel to each other at a second timing so as to generate a positive voltage corresponding to a voltage which is obtained by dividing the voltage source voltage by an integer, and means for connecting a second predetermined number of capacitive elements of said plurality of capacitive elements in parallel to each other at a third timing so as to generate a negative voltage corresponding to a voltage which is obtained by dividing the voltage source voltage by an integer.

2. A voltage converting circuit claimed in claim 1 wherein said charging means includes a first group of switch means connected to each of said plurality of capacitive elements for connecting said plurality of capacitive elements in series between said voltage source voltage and a ground terminal, wherein said positive voltage generating means includes a second group of switch means connected to each of said first predetermined number of capacitive elements for connecting said first predetermined number of capacitive elements in parallel to each other in such a manner that a positive side of said first predetermined number of capacitive elements is connected to a positive voltage output terminal, and wherein said negative voltage generating means includes a third group of switching means connected to each of said second predetermined number of capacitive elements for connecting said second predetermined number of capacitive elements in parallel to each other in such a manner that a negative side of said second predetermined number of capacitive elements is connected to a negative voltage output terminal.

3. A voltage converting circuit claimed in claim 2 wherein said switching means are formed of CMOS transistors, and respective gates of the transistors are driven with first, second and third timing signals having different phases.

4. A voltage converting circuit claimed in claim 3 further including a clock generating circuit for generating said first, second and third timing signals, comprising:

- a 2-phase clock generating circuit composed of a CMOS level shift circuit having a predetermined delay time, said clock generating circuit receiving an input clock and generating a first output clock and a second output clock of different phases;
- a frequency dividing circuit receiving one of said output clocks for generating a non-inverted signal and inverted signal;
- a first AND gate receiving said non-inverted signal and said one of said output clocks for generating said second timing signal; and
- a second AND gate receiving said inverted signal and said one of said output clocks for generating said third timing signal.

* * * * *